(12) United States Patent
Okayama et al.

(10) Patent No.: US 10,439,606 B2
(45) Date of Patent: Oct. 8, 2019

(54) SEMICONDUCTOR MODULE

(71) Applicant: Fuji Electric Co., Ltd., Kanagawa (JP)

(72) Inventors: Kenichi Okayama, Nagano (JP);
Nobuhiro Higashi, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/059,812

(22) Filed: Aug. 9, 2018

(65) Prior Publication Data

US 2019/0058468 A1 Feb. 21, 2019

(30) Foreign Application Priority Data

Aug. 15, 2017 (JP) .................................. 2017-156750
Jun. 21, 2018 (JP) .................................. 2018-118344

(51) Int. Cl.
| | |
|---|---|
| *H03K 17/60* | (2006.01) |
| *H01L 27/02* | (2006.01) |
| *H03K 17/74* | (2006.01) |
| *H03K 17/567* | (2006.01) |
| *H01L 29/739* | (2006.01) |
| *H03K 17/082* | (2006.01) |

(52) U.S. Cl.
CPC ....... *H03K 17/602* (2013.01); *H01L 27/0229* (2013.01); *H01L 29/7393* (2013.01); *H03K 17/0828* (2013.01); *H03K 17/567* (2013.01); *H03K 17/74* (2013.01); *H03K 2217/0063* (2013.01); *H03K 2217/0072* (2013.01)

(58) Field of Classification Search
CPC ............. H03K 17/602; H03K 17/0828; H03K 17/567; H03K 17/74; H03K 2217/0063; H03K 2217/0072; H01L 27/0229; H01L 29/7393

See application file for complete search history.

(56) References Cited

U.S. PATENT DOCUMENTS

2017/0033710 A1* 2/2017 Muto ................. H01L 23/49541

FOREIGN PATENT DOCUMENTS

| EP | 0 920 114 A1 | 6/1999 |
| JP | 2002-153043 A | 5/2002 |
| WO | 98/53546 A1 | 11/1998 |

* cited by examiner

*Primary Examiner* — Daniel C Puentes
(74) *Attorney, Agent, or Firm* — Chen Yoshimura LLP

(57) ABSTRACT

A semiconductor module includes a high-side switching device and a low-side switching device that respectively form an upper arm and a lower arm, freewheeling diodes that are respectively connected to the switching devices in anti-parallel, and a high-side driver circuit and a low-side driver circuit that respectively switch the high-side switching device and the low-side switching device ON and OFF. In the upper arm, an anode electrode of the freewheeling diode and a reference voltage electrode of the high-side driver circuit are directly connected via a first wiring, and the anode electrode of the freewheeling diode is connected to a reference voltage electrode of the high-side switching device via a second wiring having an inductance.

9 Claims, 14 Drawing Sheets

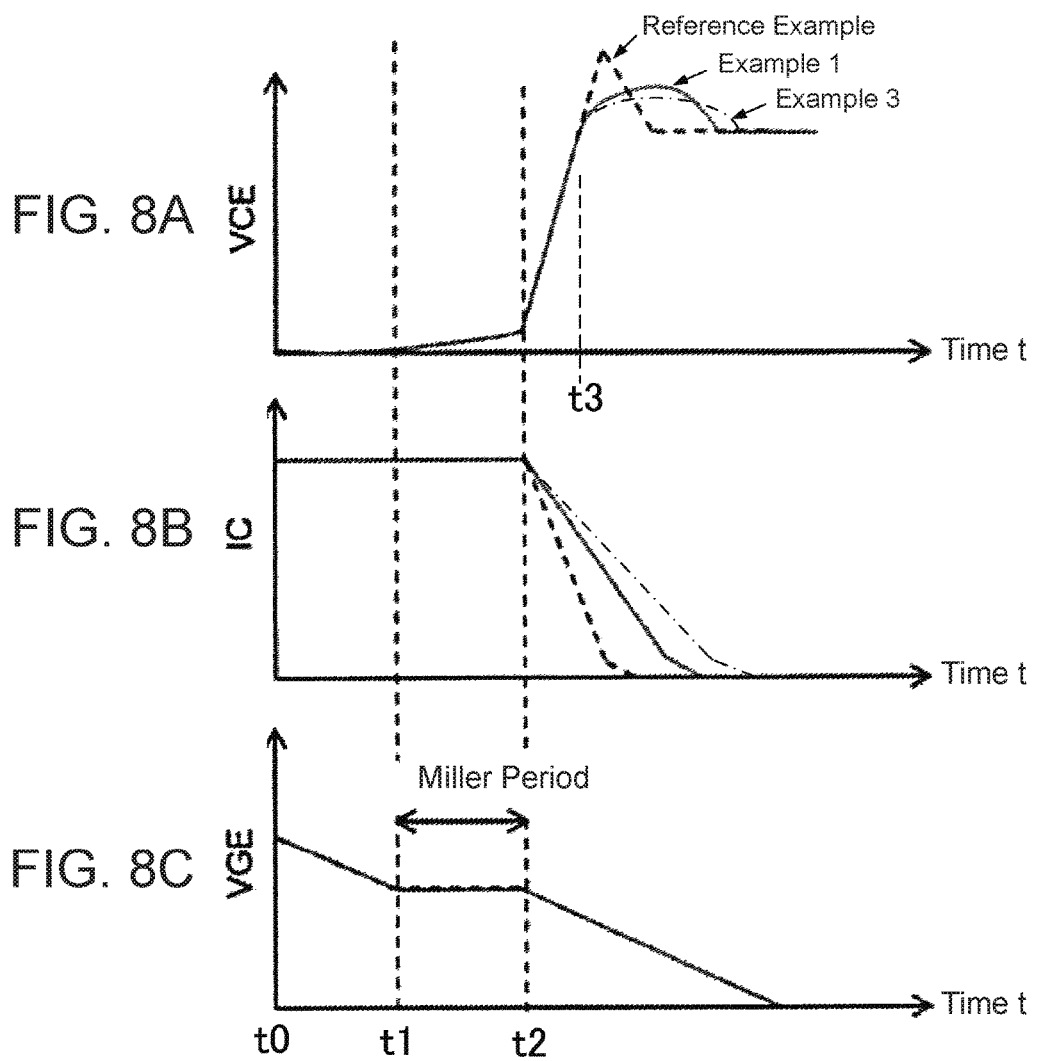

SEMICONDUCTOR MODULE

BACKGROUND OF THE INVENTION

Technical Field

The present invention relates to a semiconductor module which includes high-side semiconductor switching devices and low-side switching devices as well as driver circuits for driving these switching devices, and in which reference voltages of the high-side semiconductor switching devices are connected to reference voltages of the driver circuits.

Background Art

Inverters of the type widely used for purposes such as driving motors in consumer and industrial applications typically include semiconductor switching devices such as MOSFETs or IGBTs and driver circuits for driving those semiconductor switching devices. Moreover, intelligent power modules (hereinafter, "IPMs"), which are semiconductor modules in which the semiconductor switching devices and the driver circuits are packaged together to facilitate device miniaturization and inclusion of protection circuits, are also used. Below, an example in which IGBTs are used as the semiconductor switching devices will be described.

FIG. 1 illustrates a three-phase inverter circuit for an IPM. The IPM 1 illustrated in FIG. 1 includes high-side IGBTs $2u$, $2v$, and $2w$ and high-side freewheeling diodes (hereinafter, "FWDs") $4u$, $4v$, and $4w$ respectively connected in anti-parallel between the collectors and emitters thereof, as well as low-side IGBTs $3u$, $3v$, and $3w$ and low-side FWDs $5u$, $5v$, and $5w$ respectively connected in anti-parallel between the collectors and emitters thereof. The IPM 1 further includes driver circuits (hereinafter, "HVICs") $6u$, $6v$, and $6w$ which respectively drive the high-side IGBTs $2u$, $2v$, and $2w$, as well as a driver circuit (hereinafter, an "LVIC") 7 which drives the low-side IGBTs $3u$, $3v$, and $3w$.

As illustrated in the reference example in FIGS. 9A and 9B, the emitters (E) which take reference voltages for the high-side IGBTs $2u$, $2v$, and $2w$ illustrated in FIG. 1 are connected to reference voltages (Vs) of the HVICs $6u$, $6v$, and $6w$ via bonding wires $8u$, $8v$, and $8w$. Note that FIGS. 9A and 9B illustrate the U-phase circuit of the three phases as a representative example. Typically, these bonding wires are wired such that the wire length thereof is as short as possible.

In the inverter of the IPM 1, the high-side IGBTs $2u$, $2v$, and $2w$ and the low-side IGBTs $3u$, $3v$, and $3w$ alternately switch ON and OFF in order to convert power, and therefore as illustrated in FIGS. 10A to 10C, switching loss occurs during this switching operation. FIG. 10A illustrates the collector-emitter voltage (VCE) of an IGBT (a typical switching device) at turn-on and turn-off, and FIG. 10B illustrates the collector current (IC) waveform of the IGBT. Here, as illustrated in FIG. 10C, switching loss occurs during the periods in which VCE and IC overlap at turn-on and turn-off (indicated by the hatched areas in the figure).

Typically, at turn-on and turn-off of an IGBT, the charge of a parasitic capacitance between the gate and collector gets charged and discharged, and a period in which the gate-emitter voltage (the gate voltage relative to the reference voltage) becomes flat occurs. Below, this period will be referred to as the "Miller period".

FIGS. 11A to 11C illustrate the Miller period. FIG. 11A illustrates the voltage VCE at turn-off of an IGBT in a conventional circuit, while FIG. 11B illustrates the current IC at this time and FIG. 11C illustrates the gate voltage VGE waveform. As illustrated in FIG. 11C, the period in which the gate voltage VGE becomes flat (from t1 to t2) is the Miller period.

Meanwhile, as illustrated in FIG. 12, an inductance La between the emitters of the high-side IGBTs $2u$, $2v$, and $2w$ and the reference voltages of the HVICs $6u$, $6v$, and $6w$ is typically small compared to an inductance Lb of the wires between the emitters of the low-side IGBTs $3u$, $3v$, and $3w$ and the reference voltage of the LVIC 7. Therefore, as illustrated in FIG. 13B, the time rate of change (di/dt) of the collector current at turn-off is greater for the high-side IGBTs $2u$, $2v$, and $2w$ than for the low-side IGBTs $3u$, $3v$, and $3w$.

Letting a DC supply voltage be VDC and parasitic inductance of wires and the like be L, a surge voltage VCE (surge) can be generally represented by the following formula.

$$VCE(\text{surge}) = VDC + L \cdot di/dt$$

Therefore, as illustrated in FIG. 13A, when the high-side IGBTs $2u$, $2v$, and $2w$ switch OFF, the surge voltage VCE (surge) applied between the collectors and emitters of the IGBTs $2u$, $2v$, and $2w$ also increases. If this surge voltage VCE (surge) exceeds the withstand capability of the IGBTs, avalanche breakdown occurs. Note that in FIGS. 13A and 13B, the waveforms for the high-side circuits are illustrated by the solid lines, and the waveforms for the low-side circuits are illustrated by the dashed lines.

As described in Patent Document 1, for example, one well-known conventional method of combating this avalanche breakdown is to increase the gate resistance Rg of the IGBTs to moderate di/dt and thereby reduce the surge in VCE (surge).

However, as illustrated in FIGS. 14A to 14C, increasing the gate resistance Rg of the IGBTs causes the Miller period in which the gate-emitter voltage becomes flat to last longer. This in turn results in a problematic increase in switching loss.

Moreover, Patent Document 2 discloses a technology in which, in a modular device internally including a MOS gate-type semiconductor chip such as an IGBT, an inductance is inserted between the emitter of the semiconductor chip and the emitter of the modular device in order to reduce the surge in VCE (surge). However, Patent Document 2 only describes the semiconductor chip itself and does not provide any information related to how to reduce the surge in VCE (surge) in a circuit in which freewheeling diodes are connected in anti-parallel.

Furthermore, Patent Document 3 discloses a power converter in which a counter-electromotive force is obtained by taking advantage of magnetic coupling between a wire going from the emitter of a high-side semiconductor switch to the collector of a low-side semiconductor switch and a wire connected to the gate for driving the low-side semiconductor switch, thereby limiting the gate-emitter voltage Vge of the low-side semiconductor switch and thus reducing the turn-on current. However, the technology disclosed in Patent Document 3 is focused on reducing the turn-on current of the low-side semiconductor switch, and at turn-off, the counter-electromotive force is generated to increase Vge, which causes the magnitude of the slope −di/dt to increase and thereby results in an increase in VCE (surge).

RELATED ART DOCUMENTS

Patent Documents

Patent Document 1: Japanese Patent Application Laid-Open Publication No. 2002153043

Patent Document 2: WO 98/53546
Patent Document 3: Japanese Patent No. 6065744

SUMMARY OF THE INVENTION

Accordingly, the present invention is directed to a scheme that substantially obviates one or more of the problems due to limitations and disadvantages of the related art.

The present invention was made in light of the foregoing and aims to provide, for application to semiconductor modules having freewheeling diodes, a semiconductor module which makes it possible to reduce surge voltage at turn-off without increasing the switching loss that occurs during the Miller period.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor module (1) including: a high-side switching device (2u, 2v, 2w) and a low-side switching device (3u, 3v, 3w) that respectively form an upper arm and a lower arm; a high-side freewheeling diode (4u, 4v, 4w) and a low-side freewheeling diode (5u, 5v, 5w) that are respectively connected to the high-side and low-side switching devices in anti-parallel; and a high-side driver circuit (6u, 6v, 6w) and a low-side driver circuit (7) that respectively switch the high-side switching device and the low-side switching device ON and OFF, wherein an anode electrode of the high-side freewheeling diode (4u, 4v, 4w) and a reference voltage electrode (Vs) of the high-side driver circuit (6u, 6v, 6w) are directly connected via a first wiring (9u, 9v, 9w), and wherein the anode electrode of the high-side freewheeling diode (4u, 4v, 4w) is electrically connected to a reference voltage electrode of the high-side switching device via a second wiring (11u, 11v, 11w) having an inductance.

In the semiconductor module of the present invention in which the anode electrode of the freewheeling diode (FWD) and the reference voltage electrode of the high-side switching device are connected together via a wire, the anode electrode of the freewheeling diode and the reference voltage electrode of the high-side driver are directly connected via a wire.

This makes it possible to use the inductance of the wire (the second wiring) between the anode of the freewheeling diode and the reference voltage of the high-side switching device to reduce surge voltage at turn-off time.

Here, the "reference voltage of the switching device" refers to the voltage to which the switching device is referenced while operating, which is the same voltage as the reference voltage of the driver circuit that drives the switching device.

"Directly connected" includes not only cases in which electrode terminals are directly connected to one another but also cases in which components are connected via circuit patterns that is drawn out near terminals and has the same voltages as those terminals. Moreover, "electrically connected" refers to any electrically conductive connection and includes direct physical connections.

Moreover, for the inductance of the second wiring, the parasitic inductance of the wiring itself may be used. Furthermore, using a bonding wire for the first wiring makes it possible to easily adjust the inductance of the first wiring.

In the above-mentioned semiconductor module, the high-side switching device may be an insulated-gate bipolar transistor (IGBT), and the reference electrode of the high-side switching device may be an emitter electrode of the IGBT.

The above-mentioned semiconductor module may further include: an insulating substrate having the high-side driver circuit mounted thereon, a top surface of the high-side driver circuit having the reference voltage electrode; a conductive circuit pattern on the insulating substrate, the conductive circuit pattern being arranged in an area on the insulating substrate that is separate from an area on which the high-side driver circuit is mounted; and a conductive terminal pattern as an external terminal on the insulating substrate, the conductive terminal pattern being arranged in an area on the insulating substrate that is separate from the areas on which the high-side driver circuit and the conductive circuit pattern are respectively disposed, wherein the high-side switching device is an insulated-gate bipolar transistor (IGBT) that has, on a top surface thereof, an emitter electrode that corresponds to the reference voltage electrode of the high-side switching device and a gate electrode and that has a collector electrode on a bottom surface thereof, and the IGBT is mounted on the conductive circuit pattern so that the collector electrode is in contact with a top surface of the conductive circuit pattern and the emitter electrode and the gate electrode are accessible from above, wherein the high-side freewheeling diode connected to the high-side switching device has the anode electrode on a top surface thereof and a cathode electrode on a bottom surface thereof, and the high-side freewheeling diode is mounted on the conductive circuit pattern in an area that is separate from an area on which the IGBT is mounted so that the cathode electrode is in contact with the conductive circuit pattern and electrically connected to the collector electrode of the high-side switching device via the conductive circuit pattern and the anode electrode is accessible from above, wherein the first wiring directly connects the anode electrode on the top surface of the high-side freewheeling diode and the reference voltage electrode on the top surface thereof of the high-side driver circuit from above, wherein the second wiring directly connects the anode electrode on the top surface of the high-side freewheeling diode and the emitter electrode on the top surface of the IGBT, and wherein a bonding wire is provided to directly connect the anode electrode on the top surface of the high-side freewheeling diode and the conductive terminal pattern.

In the above-mentioned semiconductor module, the high-side driver circuit, the IGBT, the high-side freewheeling diode, and the conductive terminal pattern may be arranged in that order along a straight line in a plan view.

In another aspect, the present disclosure provides a semiconductor module including: a high-side switching device and a low-side switching device that respectively form an upper arm and a lower arm; a high-side freewheeling diode and a low-side freewheeling diode that are respectively connected to the high-side and low-side switching devices in anti-parallel; and a high-side driver circuit and a low-side driver circuit that respectively switch the high-side switching device and the low-side switching device ON and OFF, wherein an anode electrode of the high-side freewheeling diode and a reference voltage electrode of the high-side driver circuit are directly connected via a first wiring having an inductance, wherein the anode electrode of the high-side freewheeling diode is directly connected to a reference voltage electrode of the high-side switching device via a second wiring having an inductance, and wherein the first wiring and the second wiring are arranged such that magnetic coupling occurs between the first wiring and the second wiring when the high-side switching device is switched ON and OFF.

In particular, in the present invention, the first wiring and the second wiring are arranged such that currents flowing therethrough are in phase and such that a counter-electromotive force is created by the resulting magnetic coupling.

In the present invention, the first wiring connecting the anode electrode of the freewheeling diode and the reference voltage electrode of the high-side driver circuit and the second wiring connecting the anode electrode of the freewheeling diode and the reference voltage electrode of the high-side switching device are magnetically coupled, and at turn-off of the high-side switching device, a counter-electromotive force is induced on the first wiring side via the second wiring. Moreover, this counter-electromotive force is utilized to reduce the gate drive capability of the high-side switching device, thereby enhancing the reduction in surge voltage VCE (surge) at turn-off.

It is preferable that the first wiring and the second wiring be wires and that the first wiring and the second wiring be bonded to positions on wiring patterns that have the same voltage as the reference voltage of the switching device.

The semiconductor module of the present invention makes it possible to, in a semiconductor module having freewheeling diodes, reduce surge voltage at turn-off without increasing the switching loss that occurs during the Miller period.

It is to be understood that both the foregoing general description and the following detailed description are exemplary and explanatory, and are intended to provide further explanation of the invention as claimed.

BRIEF DESCRIPTION OF THE DRAWINGS

FIG. 5A illustrates a reverse recovery current path for the circuit configuration illustrated in FIG. 4 and FIG. 5B illustrates a reverse recovery current path for the circuit configuration illustrated in FIG. 2B.

FIG. 8A is a waveform comparison diagram of the voltage VCE, FIG. 8B is a waveform comparison diagram of the current IC, and FIG. 8C is a waveform comparison diagram of the gate voltage VGE, respectively when the high-side IGBT in the IPM is switched off in the reference example, Embodiments 1 and 3.

FIG. 10A is a waveform diagram of the collector-emitter voltage (VCE) of the IGBT, FIG. 10B is a waveform diagram of the collector current (IC) of the IGBT, and FIG. 10C is an explanatory drawing of the periods in which switching loss occurs.

FIG. 11A is a waveform diagram of the voltage VCE of an IGBT at turn-off, FIG. 11B is a waveform diagram of the current IC at this time, and FIG. 11C illustrates the gate voltage VGE waveform and the Miller period.

FIG. 14A is a waveform diagram of the voltage VCE, FIG. 14B is a waveform diagram of the current IC, and FIG. 14C is a waveform diagram of the gate voltage VGE.

DETAILED DESCRIPTION OF EMBODIMENTS

Figure 1:
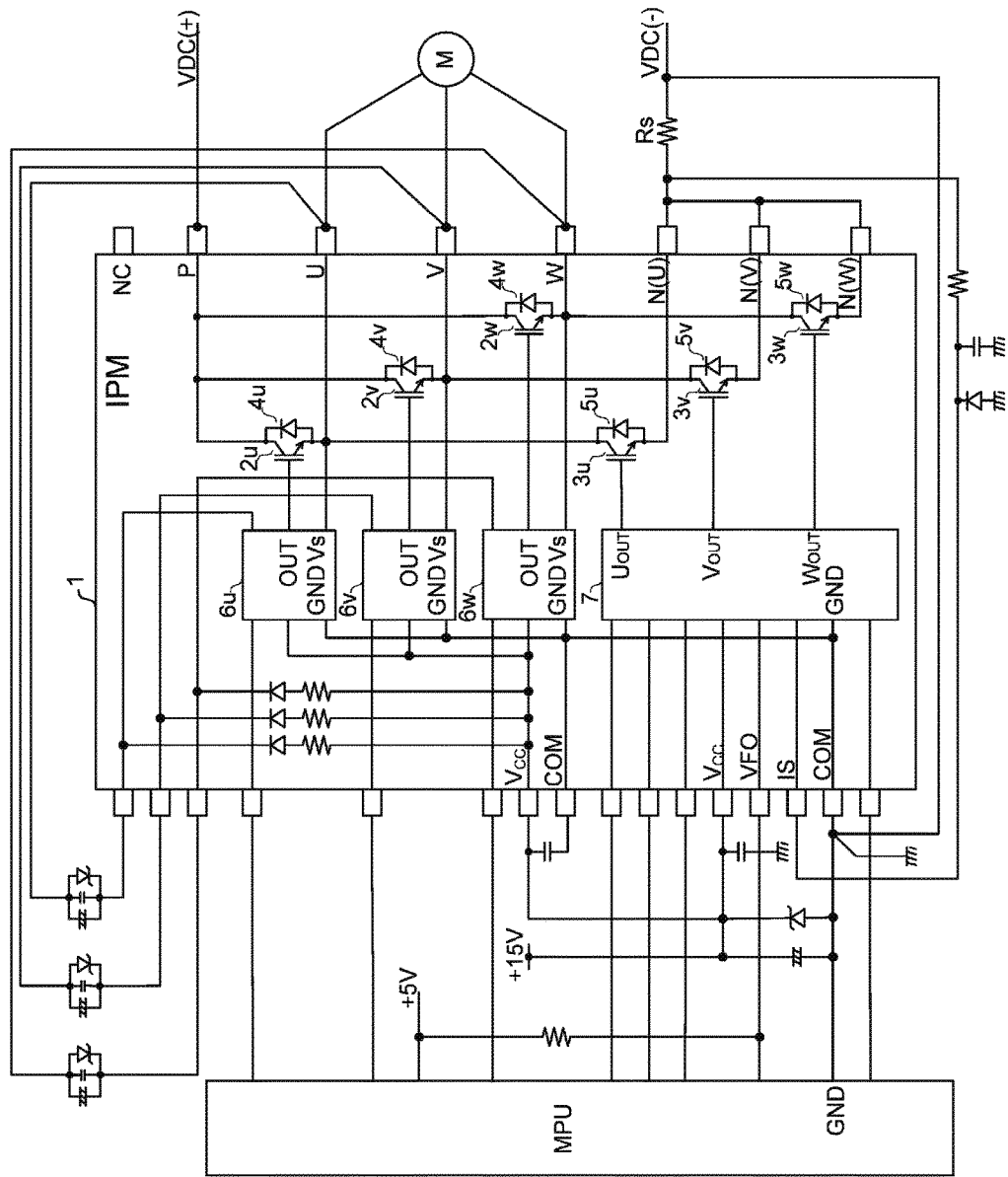
FIG. 1 is a circuit diagram of a semiconductor module (IPM) according to an embodiment of the present invention and a conventional example.

Embodiment 1 of the present invention will be described with reference to figures. Note that the overall circuit configuration of a semiconductor module (IPM) 1 according to the present embodiment is the same as is illustrated for the conventional example in FIG. 1 and therefore will not be described in detail here. Moreover, the following description focuses on a high-side circuit, and therefore the terms "high-side" and "low-side" will be omitted.

Embodiment 1

Figure 2A:
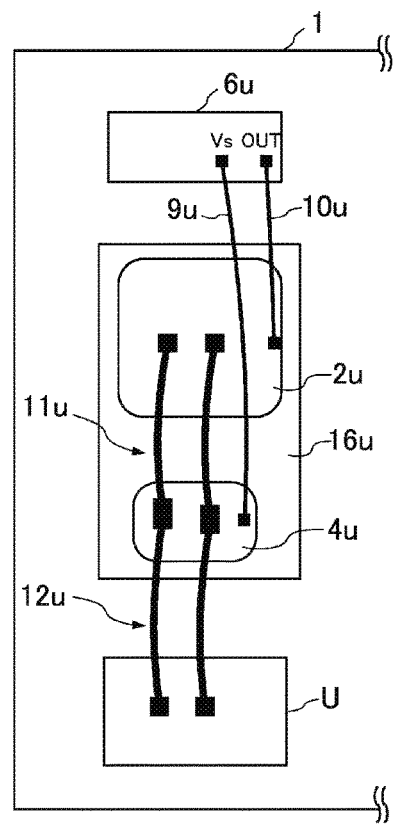
FIG. 2A is a wiring diagram of the primary components of the IPM according to Embodiment 1 of the present invention.
Figure 2B:
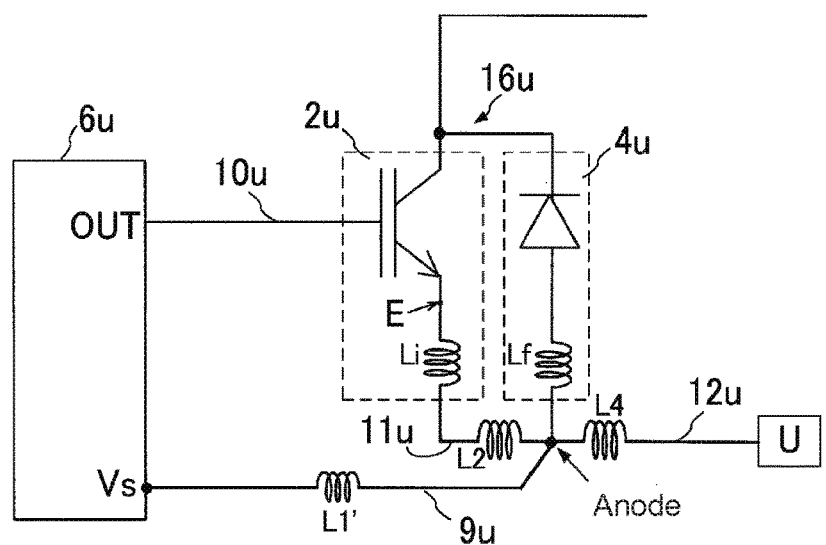
FIG. 2B is a circuit diagram of the same.

FIG. 2A illustrates the interior module wiring configuration of the IPM 1 according to Embodiment 1, and FIG. 2B illustrates the circuit configuration of the same. Note that although FIGS. 2A and 2B illustrate the U-phase circuit among the three phases as a representative example, the same configuration can be applied to the other phases as well.

As illustrated in FIG. 2A, in the IPM 1, an HVIC $6u$ ($6v$, $6w$) and an external terminal U (V, W) are arranged on an insulating substrate, and between the HVIC $6u$ ($6v$, $6w$) and the external terminal U (V, W), an IGBT $2u$ ($2v$, $2w$) and an FWD $4u$ ($4v$, $4w$) are arranged in that order from the HVIC $6u$ ($6v$, $6w$) side.

Moreover, a reference voltage Vs of the HVIC $6u$ ($6v$, $6w$) is connected to the anode of the FWD $4u$ ($4v$, $4w$) via a bonding wire $9u$ ($9v$, $9w$). Furthermore, an output OUT of the HVIC $6u$ ($6v$, $6w$) is connected to the gate of the IGBT $2u$ ($2v$, $2w$) via a bonding wire $10u$ ($10v$, $10w$). The emitter of the IGBT $2u$ ($2v$, $2w$) is connected to the anode of the FWD 4u (4v, 4w) via a bonding wire 11u (11v, 11w), and the anode of the FWD 4u (4v, 4w) is connected to the external terminal U (V, W) via a bonding wire 12u (12v, 12w). In addition, the collector of the IGBT 2u (2v, 2w) is connected to the cathode of the FWD 4u (4v, 4w) via a circuit pattern 16u (16v, 16w).

Moreover, although in FIG. 2A the two parallel bonding wires 11u (11v, 11w) and 12u (12v, 12w) are used, any number of wires can be used as appropriate given the current capacity of those wires.

The bonding wires, the IGBT device, and the FWD device have the inductances illustrated in FIG. 2B. In FIG. 2B, Li and Lf respectively represent the internal inductance of the IGBT 2u (2v, 2w) and the FWD 4u (4v, 4w), L2 represents the wire inductance of the bonding wire 11u (11v, 11w) between the emitter of the IGBT 2u (2v, 2w) and the anode of the FWD 4u (4v, 4w), and L4 represents the wire inductance of the bonding wire 12u (12v, 12w) to the external terminal U (V, W) of the IPM 1. Moreover, L1' represents the wire inductance of the bonding wire 9u (9v, 9w) between the anode of the FWD 4u (4v, 4w) and the reference voltage of the HVIC 6u (6v, 6w).

Figure 9A:
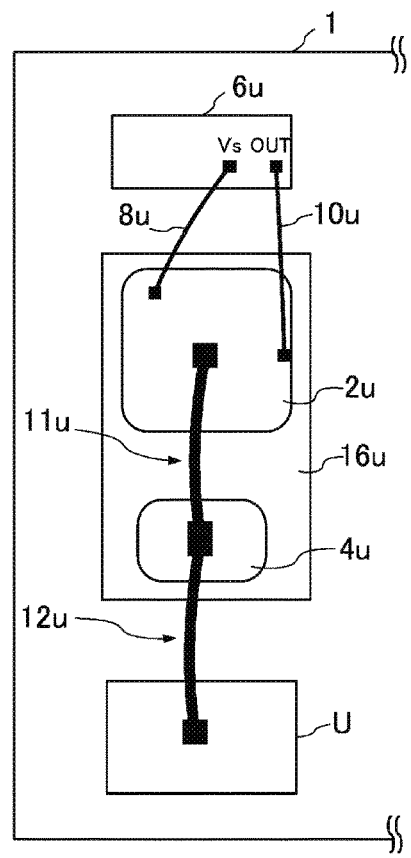
FIG. 9A is a wiring diagram of the primary components of the IPM according to the reference example.
Figure 9B:
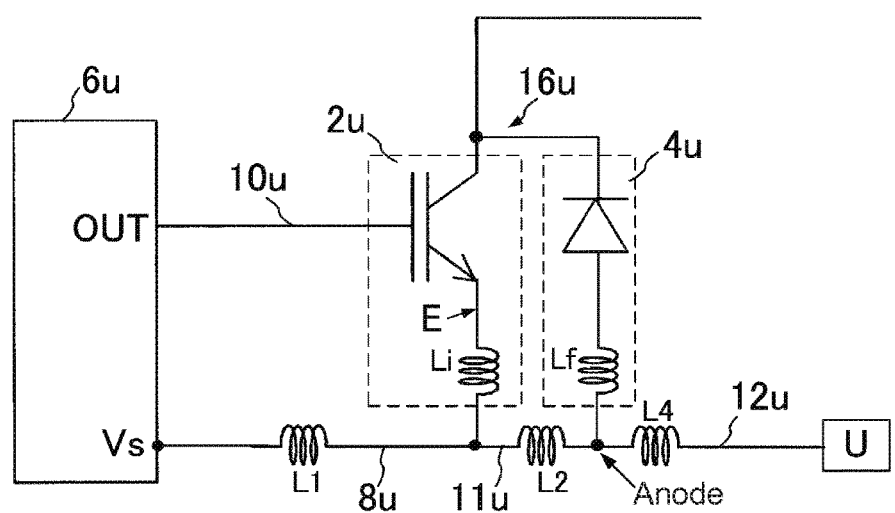
FIG. 9B is a circuit diagram of the same.
Figure 10A:
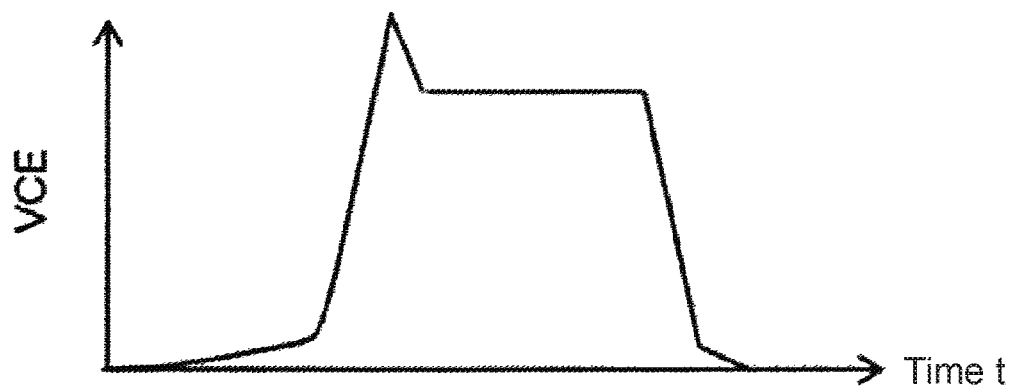
FIGS. 10A to 10C are explanatory drawings of the switching loss that occurs at turn-on and turn-off of an IGBT (a typical switching device), where
Figure 10B:
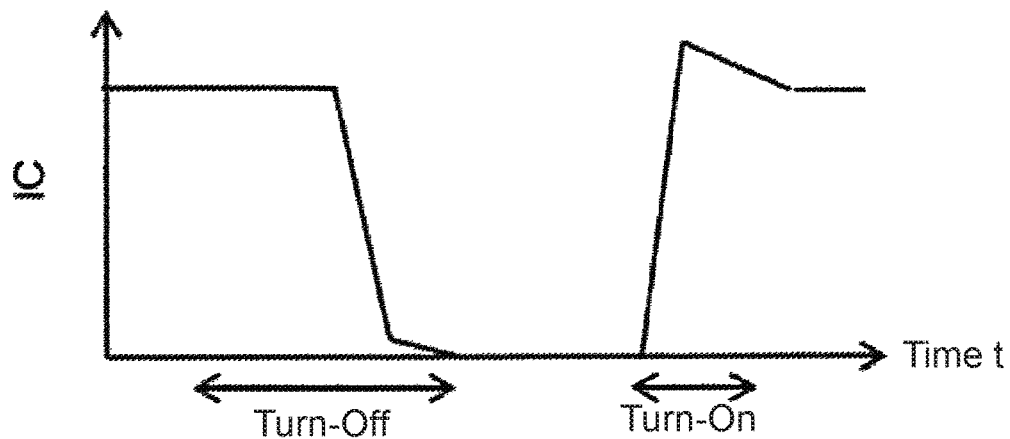
Figure 10C:
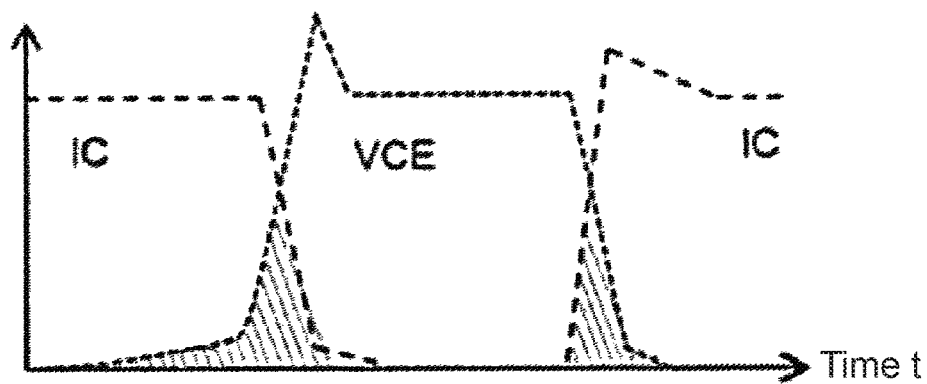
Figure 11A:
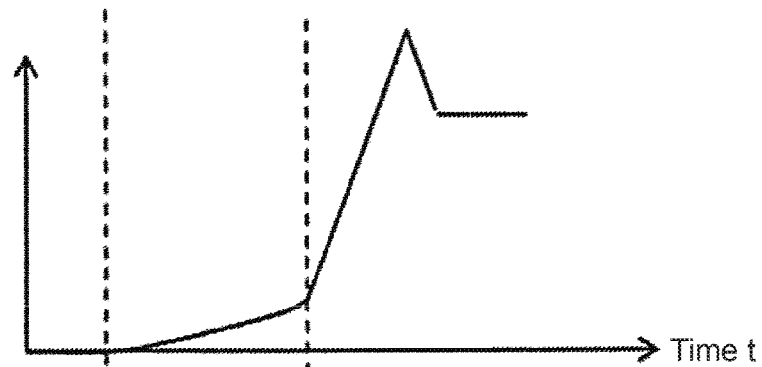
FIGS. 11A to 11C are explanatory drawings of the Miller period, where
Figure 11B:
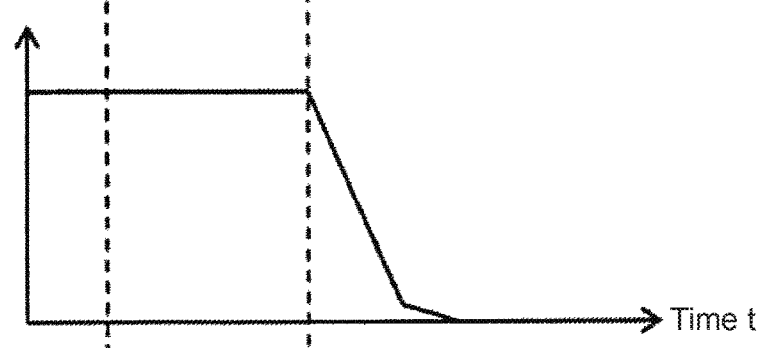
Figure 11C:
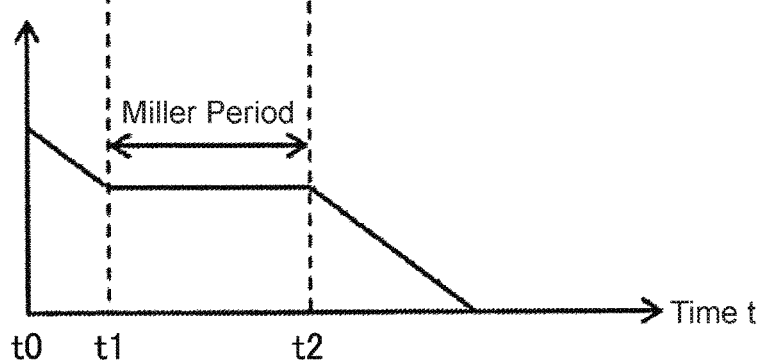
Figure 12:
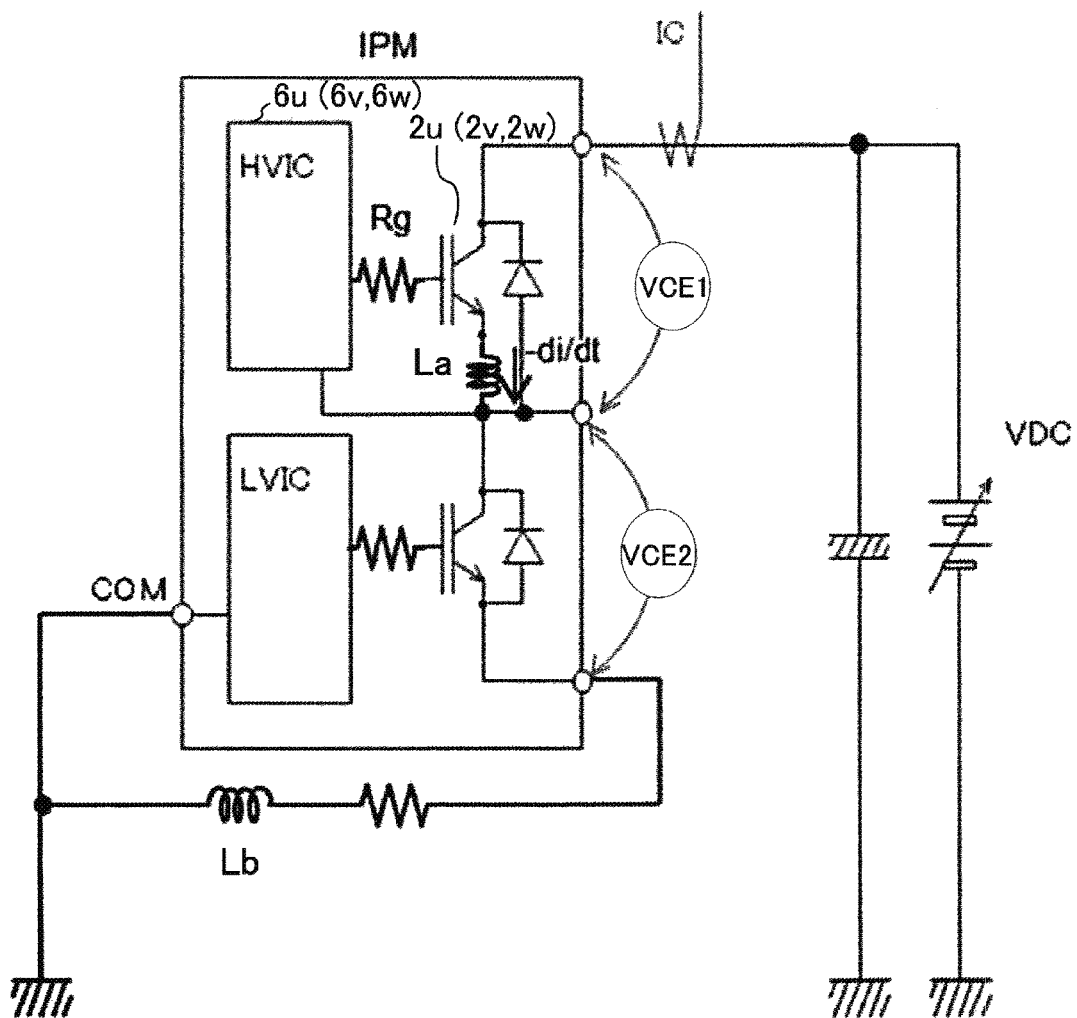
FIG. 12 is a drawing for explaining the concept of parasitic inductance in wires connected to the emitters of IGBTs.
Figure 13A:
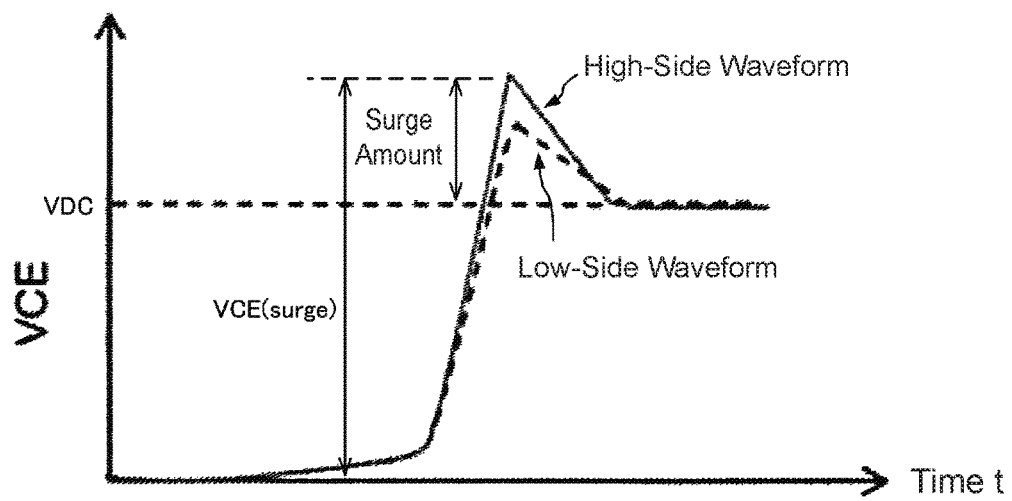
FIG. 13A is a waveform diagram of the voltages VCE of a high-side IGBT and a low-side IGBT at turn-off.
Figure 13B:
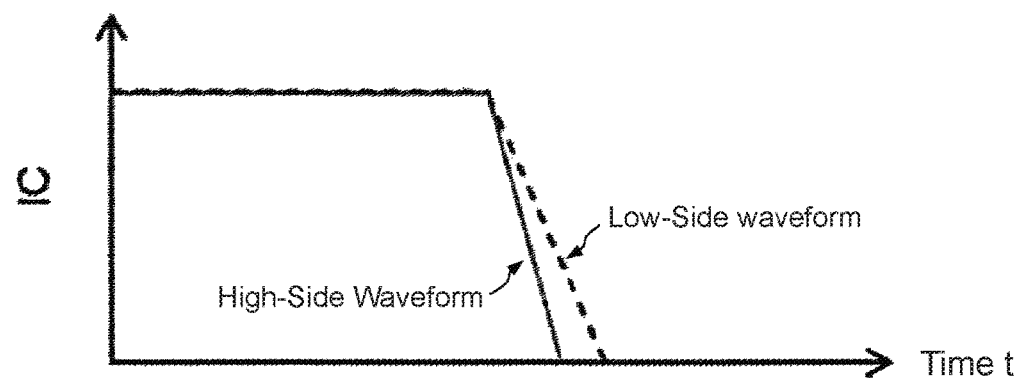
FIG. 13B is a waveform diagram of the currents IC of the same.
Figure 14A:
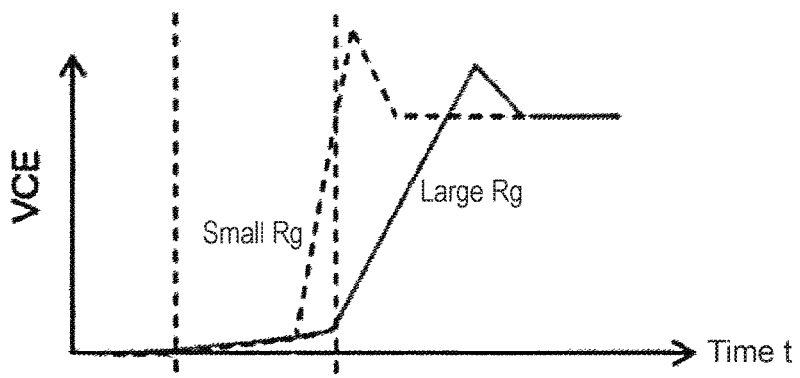
FIGS. 14A to 14C illustrate the relationship between the magnitude of a gate resistance Rg, the surge voltage at turn-off of an IGBT, and the Miller period, where
Figure 14B:
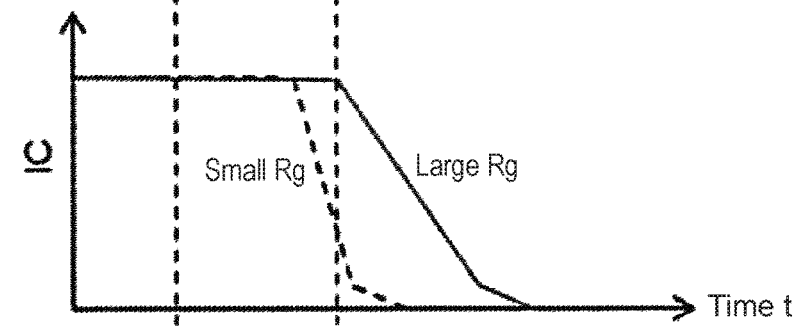
Figure 14C:
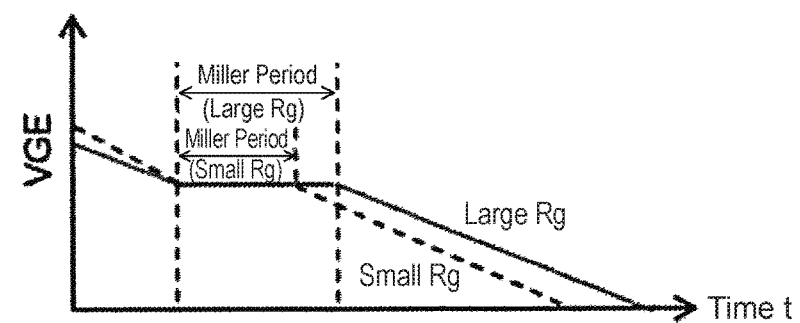

Next, the effects of the wiring configuration of the semiconductor module (IPM) 1 will be described in comparison to those of a reference example illustrated in FIGS. 9A and 9B.

In the wiring configuration of the IPM 1 of the present embodiment as illustrated in FIGS. 2A and 2B, the inductance between the emitter E (reference voltage) of the IGBT 2u (2v, 2w) and the reference voltage Vs of the HVIC 6u (6v, 6w) is Li+L2+L1'. Meanwhile, in the wiring configuration of the reference example illustrated in FIGS. 9A and 9B, the inductance between the emitter E of the IGBT 2u (2v, 2w) and the reference voltage Vs of the HVIC 6u (6v, 6w) is Li+L1. Typically, L1 and L1' are either substantially equal or, as in the configuration illustrated in FIG. 2A in which the IGBT 2u (2v, 2w) is arranged between the HVIC 6u (6v, 6w) and the FWD 4u (4v, 4w), L1' is greater. Therefore, in the wiring configuration of the present embodiment, the inductance between the emitter E of the IGBT 2u (2v, 2w) and the reference voltage Vs of the HVIC 6u (6v, 6w) is greater than the inductance in the reference example by at least an amount equal to the inductance L2. In other words, the wiring configuration of the present embodiment produces a counter-electromotive force (due to the −di/dt at turn-off of the IGBT) which is greater than a counter-electromotive force in the reference example by an amount corresponding to at least the inductance L2, thereby biasing the gate of the IGBT 2u (2v, 2w) to a greater degree. This reduces the magnitude of the slope di/dt at turn-off of the IGBT in the present embodiment than in the reference example, thereby allowing the present embodiment to achieve a greater reduction in surge voltage than in the reference example by a corresponding amount.

Note that the electromotive force produced by an inductance L can be calculated using the formula L·di/dt. Therefore, when di/dt=1000 A/µs, using a bonding wire having a wire inductance of 5 to 10 nH as the inductance L2 makes it possible to achieve a reduction of approximately 5 to 10 V in the surge voltage.

Figure 3A:
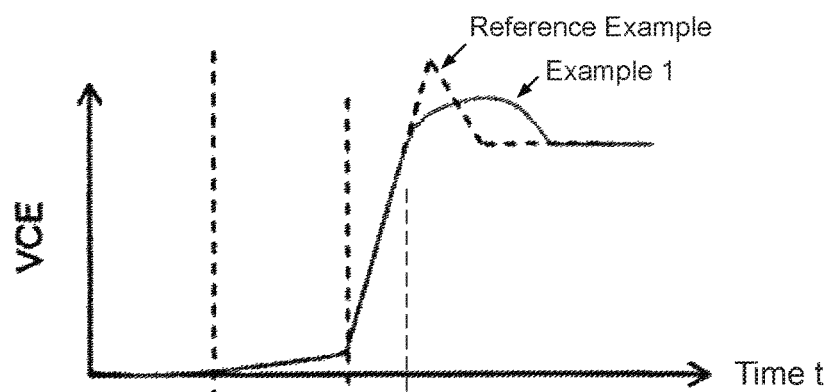
FIG. 3A is a waveform comparison diagram of the voltage VCE.
Figure 3B:
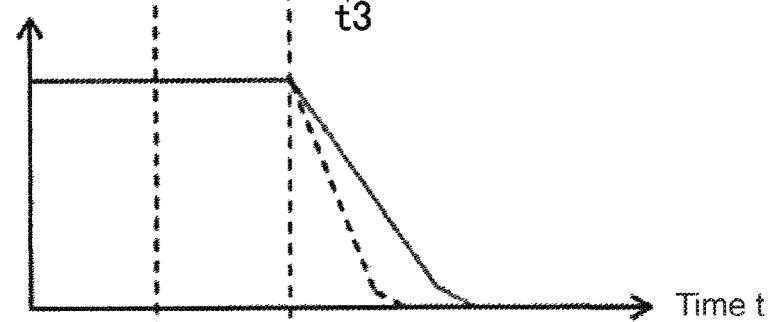
FIG. 3B is a waveform comparison diagram of the current IC.
Figure 3C:
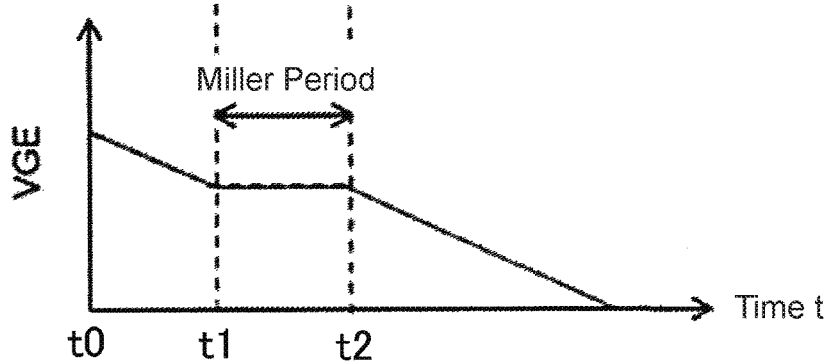
FIG. 3C is a waveform comparison diagram of the gate voltage VGE, respectively when a high-side IGBT in the IPM is switched off in Embodiment 1 and a reference example.

FIGS. 3A to 3C illustrate the changes in the voltage VCE, current IC, and voltage VGE waveforms over time at turn-off of the IGBT 2u (2v, 2w) in the wiring configuration of the present embodiment in comparison to in the reference example. In FIGS. 3A to 3C, the solid lines represent the waveforms in the present embodiment and the dashed lines represent the waveforms in the reference example. As illustrated in FIG. 3A, the peak value of the surge voltage VCE (surge) in the circuit of the present embodiment is less than the peak value of the surge voltage VCE (surge) in the circuit of the reference example. In other words, the circuit of the present embodiment keeps the slope dV/dt during the period from t1 to t2 (the Miller period) as well as during the subsequent period until t3 the same as in the reference example but also makes it possible to reduce the subsequent surge voltage VCE (surge).

Moreover, as illustrated in FIG. 3B, the magnitude of the slope di/dt is smaller in the present embodiment than in the reference example. Furthermore, as illustrated in FIG. 3C, the Miller period (from t1 to t2) is the same in both circuits.

By using the wiring configuration of the semiconductor module (IPM) according to the present embodiment as described above, in a circuit configuration in which a freewheeling diode (FWD) is connected in anti-parallel to a switching device (IGBT), the inductance increases on the emitter side of the IGBT without changing the gate resistance Rg of the IGBT. This makes it possible to reduce the surge voltage VCE (surge) without increasing the length of the Miller period and while also keeping the switching loss during the Miller period approximately the same as in conventional configurations.

Moreover, the wiring configuration illustrated in FIGS. 2A and 2B makes it possible to directly connect the anode electrode of the FWD 4u (4v, 4w) to the reference voltage electrode of the HVIC 6u (6v, 6w) via the bonding wire 9u (9v, 9w). Therefore, by using a bonding wire for which the inductance (L1') is appropriately adjusted, it is possible to set the inductance Li+L2+L1' between the emitter of the IGBT 2u (2v, 2w) and the reference voltage of the HVIC 6u (6v, 6w) to a value sufficiently greater than an inductance value in conventional configurations and to thereby adjust the magnitude of the slope di/dt at turn-off of the IGBT to a desired value which is less than the magnitude of the slope di/dt in conventional configurations. For the inductance L1' between the anode of the FWD 4u (4v, 4w) and the reference voltage of the HVIC 6u (6v, 6w), an inductor may be inserted or the parasitic inductance of the wire can be used.

In particular, in a configuration in which the IGBT 2u (2v, 2w) is arranged between the HVIC 6u (6v, 6w) and the FWD 4u (4v, 4w) as in FIG. 2, the reference voltage terminal (Vs) of the HVIC 6u (6v, 6w) is directly connected to the anode terminal of the FWD 4u (4v, 4w) via the bonding wire 9u (9v, 9w), which increases the parasitic inductance (L1') of the bonding wire and thereby makes it possible to easily reduce the surge voltage VCE (surge).

Furthermore, connecting the emitter electrode of the IGBT 2u (2v, 2w) to the anode electrode of the FWD 4u (4v, 4w) via a bonding wire makes it possible to adjust the inductance L2 in addition to the inductance L1'.

Comparison Example

Figure 4:
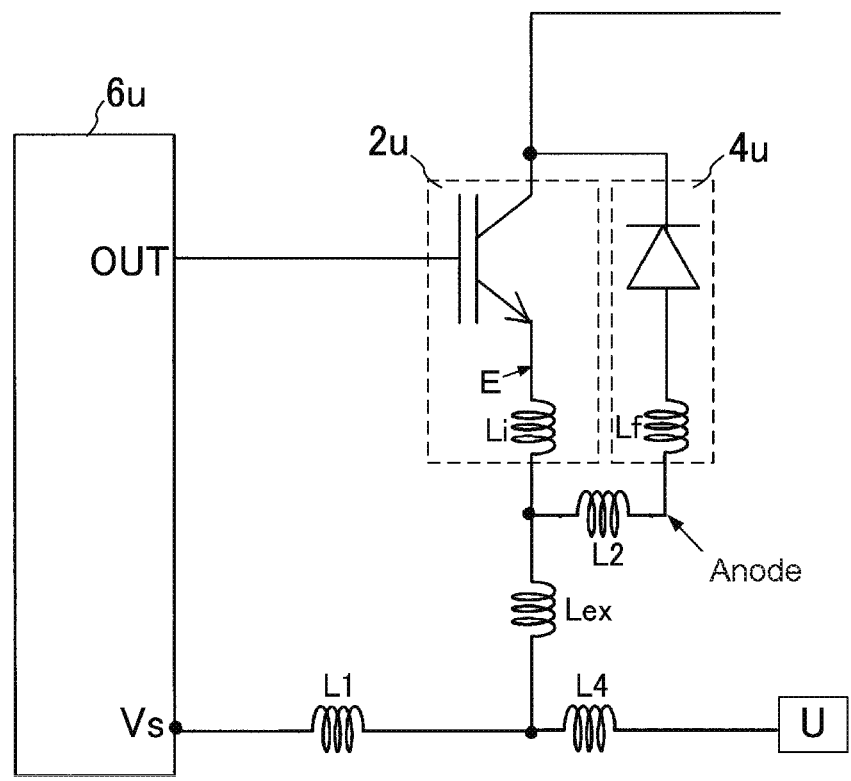
FIG. 4 is a circuit diagram of an IGBT according to Comparison Example of the present invention (a comparison example relative to FIGS. 2A and 2B).

In the configuration illustrated in FIGS. 2A and 2B, the reference voltage electrode of the HVIC 6u (6v, 6w) and the anode electrode of the FWD 4u (4v, 4w) are directly wire-bonded together. However, as illustrated in FIG. 4, an external inductance Lex can also be inserted between the emitter electrode of the IGBT 2u (2v, 2w) and the reference voltage of the HVIC 6u (6v, 6w). In the circuit configuration illustrated in FIG. 4, the inductance between the emitter E (reference voltage) of the IGBT 2u (2v, 2w) and the reference voltage Vs of the HVIC 6u (6v, 6w) is Li+Lex+L1. In other words, the inductance on the emitter side of the IGBT 2u (2v, 2w) is greater than in the circuit configuration of the reference example illustrated in FIGS. 9A and 9B by an amount equal to Lex. This increases the IGBT gate bias by a corresponding amount and makes it possible to reduce di/dt.

Similar to the wiring configuration illustrated in FIGS. 2A and 2B, the wiring configuration illustrated in FIG. 4 makes it possible to increase only the inductance on the emitter side without changing the resistance value of the gate resistance Rg of the IGBT. Therefore, Comparison Example similarly makes it possible to reduce the surge voltage VCE (surge) at turn-off without increasing the loss that occurs during the Miller period.

It should be noted that the wiring configuration illustrated in FIG. 4 results in an increase in reverse recovery current in comparison to the wiring configuration illustrated in FIGS. 2A and 2B. Here, "reverse recovery current" refers to the current which flows during the instant at which a voltage applied to a freewheeling diode (FWD) switches from being a forward voltage to being a reverse voltage, and the magnitude of this reverse voltage current is determined by the inductance of the current path formed by the freewheeling diode (FWD).

Figure 5A:
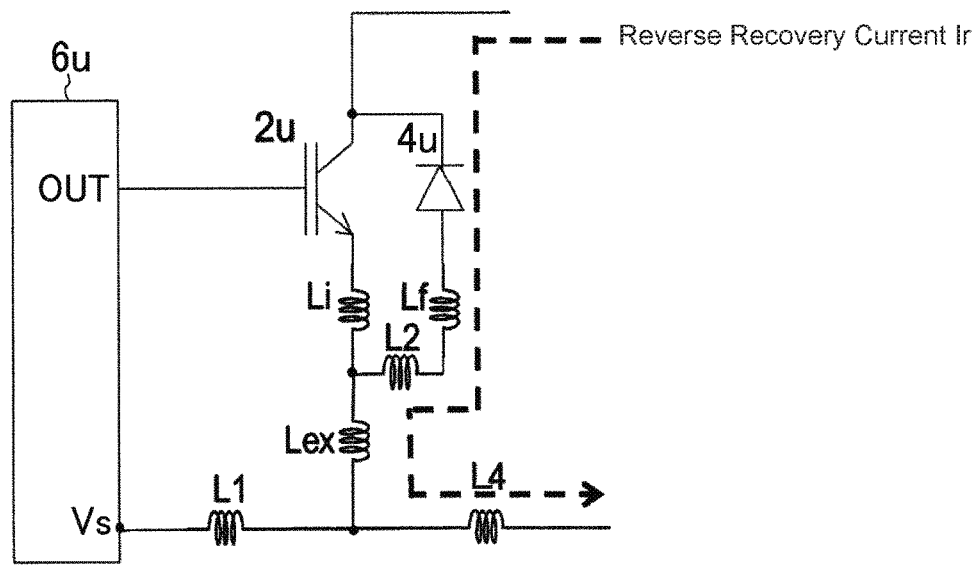
FIGS. 5A and 5B are drawings for explaining the differences between the effects of the circuit configurations illustrated in FIGS. 2B and 4, where

As illustrated by the current path shown in FIG. 5A, the inductance during the reverse recovery current period in the circuit configuration illustrated in FIG. 4 is Lf+L2+Lex+L4. Meanwhile, the inductance during the reverse recovery current period in the circuit configuration illustrated in FIG. 9B is Lf+L4. Therefore, although the circuit configuration of Comparison Example illustrated in FIG. 4 reduces the surge voltage VCE (surge) at turn-off, this configuration also exhibits the disadvantage of increasing surge voltage during the recovery period of the FWD.

Figure 5B:
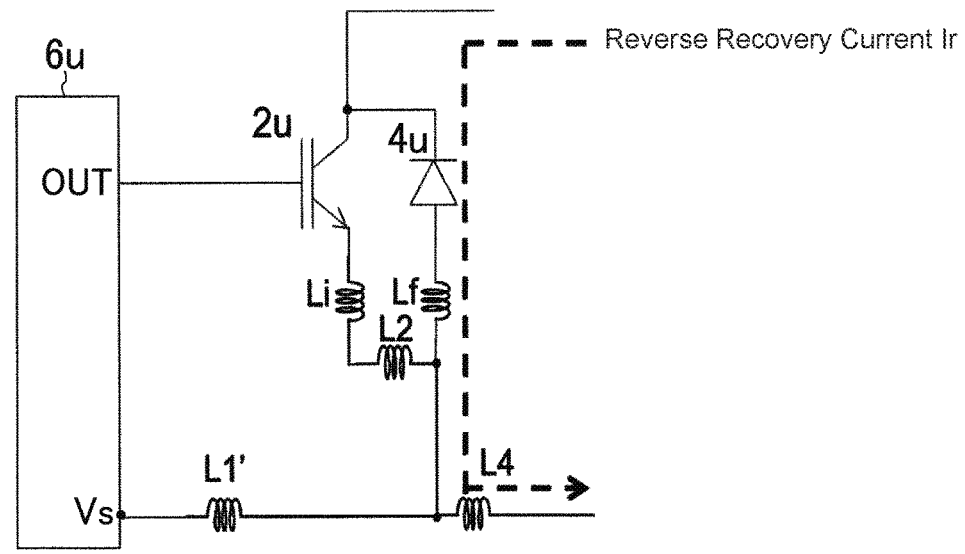

Meanwhile, as illustrated by the current path shown in FIG. 5B, in the circuit configuration illustrated in FIG. 2 the inductance during the reverse recovery current period is Lf+L4, which is the same as in the reference example illustrated in FIG. 6. Therefore, the circuit configuration illustrated in FIG. 2 does not exhibit this disadvantage of increasing surge voltage during the recovery period of the FWD relative to in the reference example.

As described above, in the semiconductor module according to the present embodiments, increasing the inductance on the emitter side of the IGBT makes it possible to reduce the surge voltage VCE (surge) at turn-off without increasing the loss that occurs during the Miller period. Furthermore, the circuit configuration illustrated in FIGS. 2A and 2B, in which the anode electrode of the freewheeling diode (FWD) is directly connected to the reference voltage electrode of the driver circuit (HVIC) via a bonding wire, exhibits the practically advantageous effect of making it possible to achieve the above advantage without increasing the surge voltage during the recovery period.

Embodiment 2

Next, Embodiment 2 of the present invention will be described. In the present embodiment, in contrast to the wiring configuration illustrated in FIG. 2A, the bonding wire 9u (9v, 9w) having the inductance L1' and the bonding wire 11u (11v, 11w) having the inductance L2 are arranged neighboring one another. The resulting magnetic coupling between the inductances L1' and L2 creates a counter-electromotive force in the inductance L1' of the bonding wire 9u (9v, 9w) at turn-off of the IGBT 2u (2v, 2w), and this counter-electromotive force is utilized to reduce the gate drive capability of the IGBT 2u (2v, 2w) and to thereby reduce the surge voltage VCE (surge) at turn-off.

Figure 6A:
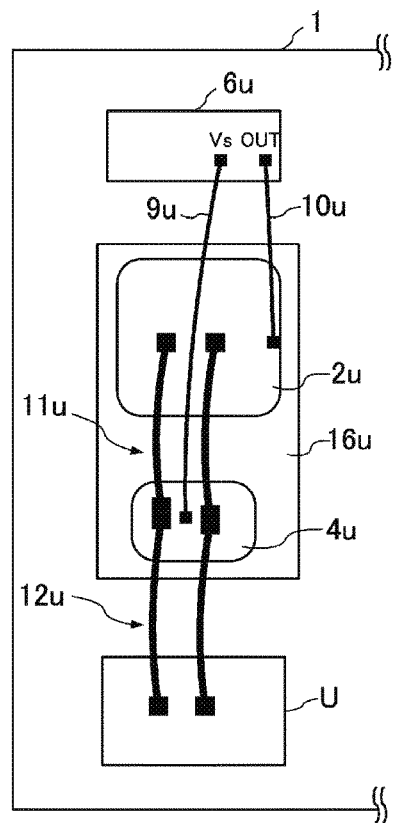
FIG. 6A is a wiring diagram of the primary components of an IPM according to Embodiment 2 of the present invention.
Figure 6B:
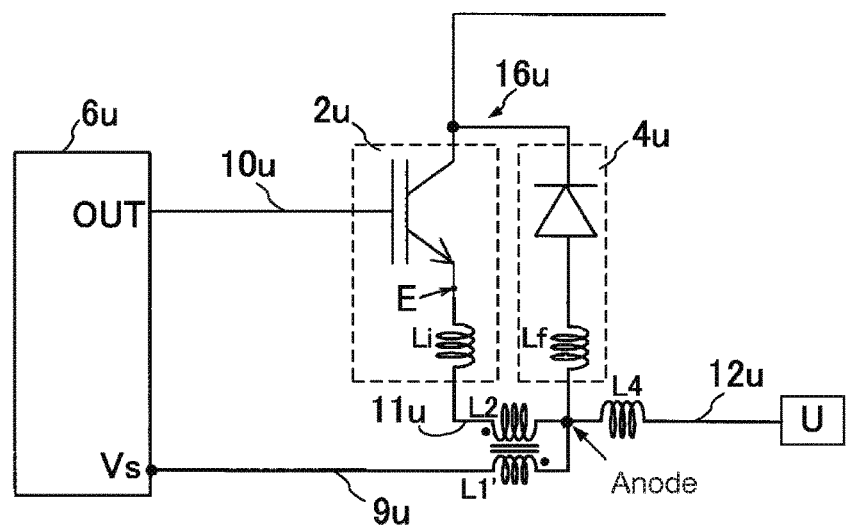
FIG. 6B is a circuit diagram of the same.

FIG. 6A illustrates the interior module wiring configuration of an IPM 1 according to Embodiment 2 of the present embodiment, and FIG. 6B illustrates the circuit configuration of the same. Note that although FIG. 6A illustrates the U-phase circuit among the three phases as a representative example, the same configuration can be applied to the other phases as well.

The wiring configuration of the present embodiment is specifically characterized in that the bonding wire 9u (9v, 9w) is bonded to a substantially center position between the terminals of the FWD 4u (4v, 4w) for the two bonding wires 11u (11v, 11w). Selecting the position at which the bonding wire 9u (9v, 9w) is connected to the FWD 4u (4v, 4w) in this manner makes it possible to pass the bonding wire 9u (9v, 9w) (which extends from the reference voltage Vs of the HVIC 6u (6v, 6w) to the FWD 4u (4v, 4w)) between the two bonding wires 11u (11v, 11w), thereby making it possible to establish a segment (hereinafter, a "parallel wiring segment") in which the bonding wires 9u (9v, 9w) and 11u (11v, 11w) are wired parallel to one another with no more than a prescribed interval therebetween. Moreover, in this parallel wiring segment of the wiring configuration illustrated in FIG. 6A, the currents respectively flowing through the bonding wires 9u (9v, 9w) and 11u (11v, 11w) are in phase.

The bonding wires 9u (9v, 9w) and 11u (11v, 11w) respectively have an inductance L1' and L2. The parasitic inductance of the wires can be used as this inductance. In this case, the intervals between the bonding wires 9u (9v, 9w) and 11u (11v, 11w) as well as the length of the parallel wiring segment affect the magnitude of the counter-electromotive force resulting from mutual inductance or magnetic coupling. In other words, reducing the intervals between the bonding wires 9u (9v, 9w) and 11u (11v, 11w) or increasing the length of the parallel wiring segment makes it possible to increase the mutual inductance between the bonding wires 9u (9v, 9w) and 11u (11v, 11w) as well as the counter-electromotive force resulting therefrom.

Figure 7:
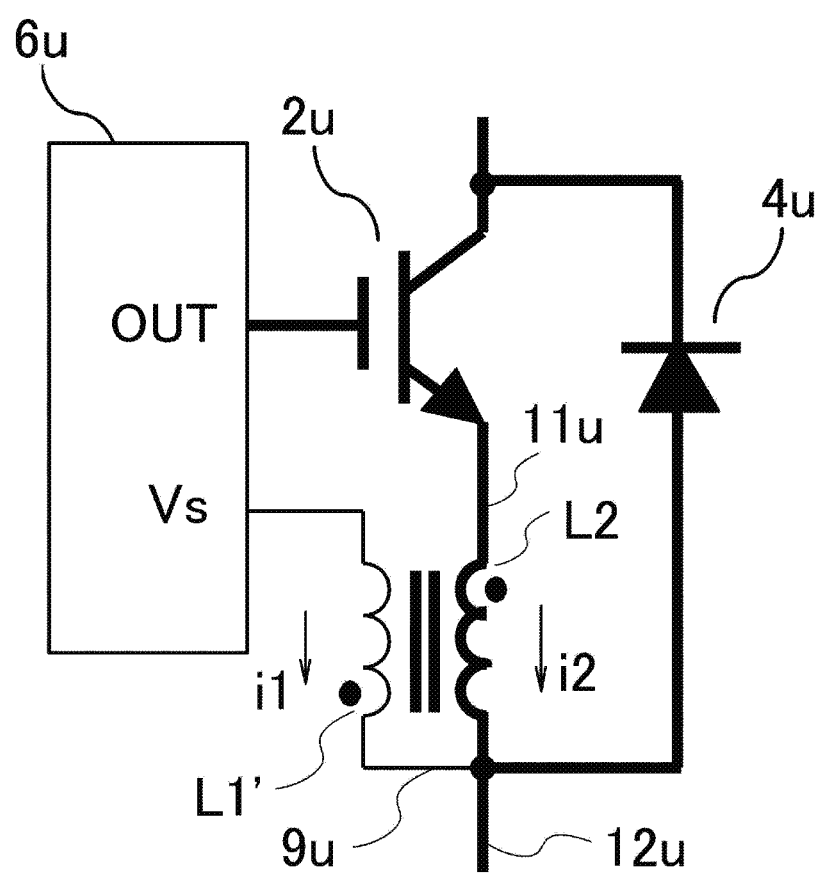
FIG. 7 is an explanatory drawing of the operation and effects of Embodiment 2.

Next, the operation and effects of the wiring configuration illustrated in FIG. 6A will be described with reference to FIG. 7. Among the components of the IPM 1, FIG. 7 only depicts the components that are required to explain magnetic coupling. In this figure, the current (i1) flowing from the reference voltage electrode (Vs) of the HVIC 6u (6v, 6w) via the bonding wire 9u (9v, 9w) and the current (i2) flowing from the emitter of the IGBT 2u (2v, 2w) are in phase, as indicated by the arrows pointing in the same direction.

In this circuit configuration, when the IGBT 2u (2v, 2w) switches OFF, the current (i2) begins to decrease. As a result, the mutual inductance with the bonding wire 11u (11v, 11w) creates a counter-electromotive force (equal to the magnitude of the mutual inductance times the time rate of change of the current i2) in the magnetically coupled bonding wire 9u (9v, 9w), thereby causing an increase in the emitter voltage of the IGBT 2u (2v, 2w) relative to the reference voltage Vs of the HVIC 6u (6v, 6w). This biases the gate of the IGBT 2u (2v, 2w) and thereby reduces the gate drive capability of the HVIC 6u (6v, 6w). In other words, in the wiring configuration illustrated in FIG. 6A, the magnetic coupling between the bonding wires 11u (11v, 11w) and the bonding wire 9u (9v, 9w) acts to increase the respective inductances L2 and L1' thereof. This, as shown by the dot-dashed lines in FIGS. 8A to 8C, reduces the magnitude of the time rate of change di/dt of the collector current at turn-off, thereby reducing the surge in VCE (surge).

Practically speaking, for bonding wires 9u (9v, 9w) and 11u (11v, 11w) both having a normal current capacity, it is preferable that the interval therebetween be approximately 3 mm or less (preferably, 1.5 mm or less) and that the length of the parallel wiring segment be 10 mm or greater (preferably, 15 mm or greater).

Under these conditions, for a di/dt of 1000 A/µs, a reduction of approximately 20 V in VCE surge can be expected relative to in conventional configurations (the reference example).

Moreover, although in FIG. 6A the bonding wire 11*u* (11*v*, 11*w*) is constituted by two wiring lines and the bonding wire 9*u* (9*v*, 9*w*) is arranged at a substantially center position therebetween, the number of bonding wiring lines 11*u* (11*v*, 11*w*) is not limited to this and may be any number n (where n is an integer greater than or equal to 2), in which case n−1 bonding wires 9*u* (9*v*, 9*w*) may be respectively arranged between the bonding wires 11*u* (11*v*, 11*w*). Meanwhile, if the current capacity of the bonding wire 11*u* (11*v*, 11*w*) is sufficient, a single wire may be used. In this case, the bonding wire 9*u* (9*v*, 9*w*) is connected to near the position at which the bonding wire 11*u* (11*v*, 11*w*) is connected to the FWD 4*u* (4*v*, 4*w*).

The present embodiment as described above exhibits the following advantageous effects in addition to those of Embodiment 1. In the present embodiment, the circuit is configured such that, without changing the gate resistance, the "wire going from the emitter terminal of the IGBT to the anode terminal of the FWD" is magnetically coupled to the "wire going from the reference voltage terminal (Vs) of the HVIC to the anode terminal of the FWD". Therefore, the electromotive force induced at turn-off of the IGBT decreases the gate drive capability of the IGBT, thereby making it possible to reduce −di/dt as illustrated in FIG. 8B. This, in turn, makes it possible to reduce VCE (surge) without increasing switching loss. Moreover, in comparison to Embodiment 1, the same degree of reduction in VCE (surge) can be achieved using a shorter wire length, thereby making it possible to miniaturize the IPM package.

The present invention is not limited to the embodiments described above, and various modifications can be made without departing from the spirit of the invention. For example, although above an NPN IGBT was used as the semiconductor switching device as an example and circuits in which the emitter terminal was the reference voltage electrode of the IGBT were described, the present invention is equally applicable when using a PNP IGBT and working with a circuit in which the collector terminal is the reference voltage electrode of the IGBT.

Moreover, the present invention is similarly applicable when using semiconductor switching devices other than IGBTs, such as bipolar transistors and MOSFETs. Here, when using an NMOS, the reference voltage electrode would be the source electrode, and when using a PMOS, the reference voltage electrode would be the drain electrode.

The bonding wires should be bonded to positions on the wiring patterns that respectively have the same voltages as the anode terminal of the FWD, the reference voltage terminal of the HVIC, and the reference voltage terminal of the IGBT. The switching devices or the freewheeling diodes or both can be made of any of silicon, silicon carbide, a gallium nitride material, a gallium oxide material, or diamond.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor module, comprising:
   a high-side switching device and a low-side switching device that respectively form an upper arm and a lower arm;
   a high-side freewheeling diode and a low-side freewheeling diode that are respectively connected to the high-side and low-side switching devices in anti-parallel; and
   a high-side driver circuit and a low-side driver circuit that respectively switch the high-side switching device and the low-side switching device ON and OFF,
   wherein an anode electrode of the high-side freewheeling diode and a reference voltage electrode of the high-side driver circuit are directly connected via a first wiring,
   wherein the anode electrode of the high-side freewheeling diode is electrically connected to a reference voltage electrode of the high-side switching device via a second wiring having an inductance,
   wherein the semiconductor module further comprises:
      an insulating substrate having the high-side driver circuit mounted thereon, a top surface of the high-side driver circuit having the reference voltage electrode;
      a circuit pattern on the insulating substrate, the circuit pattern being arranged in an area on the insulating substrate that is separate from an area on which the high-side driver circuit is mounted; and
      a conductive terminal pattern as an external terminal on the insulating substrate, the conductive terminal pattern being arranged in an area on the insulating substrate that is separate from the areas on which the high-side driver circuit and the circuit pattern are respectively disposed,
   wherein the high-side switching device is an insulated-gate bipolar transistor (IGBT) that has, on a top surface thereof, an emitter electrode that corresponds to said reference voltage electrode of the high-side switching device and a gate electrode and that has a collector electrode on a bottom surface thereof, and the IGBT is mounted on the circuit pattern so that the collector electrode is in contact with a top surface of the circuit pattern and the emitter electrode and the gate electrode are accessible from above,
   wherein the high-side freewheeling diode connected to the high-side switching device has said anode electrode on a top surface thereof and a cathode electrode on a bottom surface thereof, and the high-side freewheeling diode is mounted on the circuit pattern in an area that is separate from an area on which the IGBT is mounted so that the cathode electrode is in contact with the circuit pattern and electrically connected to the collector electrode of the high-side switching device via the circuit pattern and the anode electrode is accessible from above,
   wherein the first wiring directly connects the anode electrode on the top surface of the high-side freewheeling diode and the reference voltage electrode on the top surface thereof of the high-side driver circuit from above,
   wherein the second wiring directly connects the anode electrode on the top surface of the high-side freewheeling diode and the emitter electrode on the top surface of the IGBT, and wherein a bonding wire is provided to directly connect the anode electrode on the top surface of the high-side freewheeling diode and the conductive terminal pattern.

2. The semiconductor module according to claim 1, wherein the inductance of the second wiring is parasitic inductance of the wiring itself.

3. The semiconductor module according to claim 1, wherein the first wiring is a wire that is bonded to the anode electrode of the high-side freewheeling diode.

4. The semiconductor module according to claim 1, wherein the high-side driver circuit, the IGBT, the high-side freewheeling diode, and the conductive terminal pattern are arranged in that order along a straight line in a plan view.

5. The semiconductor module according to claim 1, wherein the first wiring has an inductance, and
wherein the first wiring and the second wiring are arranged such that magnetic coupling occurs between the first wiring and the second wiring when the high-side switching device is switched ON and OFF.

6. A semiconductor module, comprising:
a high-side switching device and a low-side switching device that respectively form an upper arm and a lower arm;
a high-side freewheeling diode and a low-side freewheeling diode that are respectively connected to the high-side and low-side switching devices in anti-parallel; and
a high-side driver circuit and a low-side driver circuit that respectively switch the high-side switching device and the low-side switching device ON and OFF,
wherein an anode electrode of the high-side freewheeling diode and a reference voltage electrode of the high-side driver circuit are directly connected via a first wiring having an inductance,
wherein the anode electrode of the high-side freewheeling diode is directly connected to a reference voltage electrode of the high-side switching device via a second wiring having an inductance,
wherein the first wiring and the second wiring are arranged such that magnetic coupling occurs between the first wiring and the second wiring when the high-side switching device is switched ON and OFF,
wherein the semiconductor module further comprises:
an insulating substrate having the high-side driver circuit mounted thereon, a top surface of the high-side driver circuit having the reference voltage electrode;
a circuit pattern on the insulating substrate, the circuit pattern being arranged in an area on the insulating substrate that is separate from an area on which the high-side driver circuit is mounted; and
a conductive terminal pattern as an external terminal on the insulating substrate, the conductive terminal pattern being arranged in an area on the insulating substrate that is separate from the areas on which the high-side driver circuit and the circuit pattern are respectively disposed,
wherein the high-side switching device is an insulated-gate bipolar transistor (IGBT) that has, on a top surface thereof, an emitter electrode that corresponds to said reference voltage electrode of the high-side switching device and a gate electrode and that has a collector electrode on a bottom surface thereof, and the IGBT is mounted on the circuit pattern so that the collector electrode is in contact with a top surface of the circuit pattern and the emitter electrode and the gate electrode are accessible from above,
wherein the high-side freewheeling diode connected to the high-side switching device has said anode electrode on a top surface thereof and a cathode electrode on a bottom surface thereof, and the high-side freewheeling diode is mounted on the circuit pattern in an area that is separate from an area on which the IGBT is mounted so that the cathode electrode is in contact with the circuit pattern and electrically connected to the collector electrode of the high-side switching device via the circuit pattern and the anode electrode is accessible from above,
wherein the first wiring directly connects the anode electrode on the top surface of the high-side freewheeling diode and the reference voltage electrode on the top surface thereof of the high-side driver circuit from above,
wherein the second wiring directly connects the anode electrode on the top surface of the high-side freewheeling diode and the emitter electrode on the top surface of the IGBT,
wherein the second wiring is a pair of wiring lines that each directly connect the anode electrode of the high-side freewheeling diode and the emitter electrode the IGBT, and the pair of wiring lines sandwich the first wiring in a plan view so as to produce the magnetically coupling between the first wiring and the second wiring, and
wherein a bonding wire is provided to directly connect the anode electrode on the top surface of the high-side freewheeling diode and the conductive terminal pattern.

7. The semiconductor module according to claim 6, wherein the first wiring and the second wiring are arranged such that currents flowing therethrough are in phase.

8. The semiconductor module according to claim 6, wherein the inductance of the first wiring and the inductance of the second wiring are respectively parasitic inductance of the first wiring itself and parasitic inductance of the second wiring itself.

9. The semiconductor module according to claim 6, wherein the high-side driver circuit, the IGBT, the high-side freewheeling diode, and the conductive terminal pattern are arranged in that order along a straight line in the plan view.

* * * * *